(12) United States Patent
Sun et al.

(10) Patent No.: US 11,535,796 B2
(45) Date of Patent: Dec. 27, 2022

(54) QUANTUM DOT MATERIAL, AND PREPARATION METHOD AND USE THEREOF

(71) Applicant: SHENZHEN PLANCK INNOVATION TECHNOLOGY CO., LTD, Shenzhen (CN)

(72) Inventors: Xiaowei Sun, Shenzhen (CN); Kai Wang, Shenzhen (CN); Fan Fang, Shenzhen (CN); Hongcheng Yang, Shenzhen (CN); Bing Xu, Shenzhen (CN); Yizun Liu, Shenzhen (CN); Xiang Li, Shenzhen (CN)

(73) Assignee: SHENZHEN PLANCK INNOVATION TECHNOLOGY CO., LTD, Shenzhen (CN)

(*) Notice: Subject to any disclaimer, the term of this patent is extended or adjusted under 35 U.S.C. 154(b) by 281 days.

(21) Appl. No.: 15/931,781

(22) Filed: May 14, 2020

(65) Prior Publication Data
US 2021/0032534 A1 Feb. 4, 2021

(30) Foreign Application Priority Data
Aug. 2, 2019 (CN) .......................... 201910711600.1

(51) Int. Cl.
| C09K 11/02 | (2006.01) |
| C09K 11/08 | (2006.01) |
| C09K 11/62 | (2006.01) |
| C09K 11/66 | (2006.01) |
| C09K 11/70 | (2006.01) |
| C09K 11/88 | (2006.01) |
| H01L 33/50 | (2010.01) |
| B82Y 40/00 | (2011.01) |

(52) U.S. Cl.
CPC ........... *C09K 11/025* (2013.01); *B82Y 40/00* (2013.01); *C09K 11/0883* (2013.01); *C09K 11/621* (2013.01); *C09K 11/664* (2013.01); *C09K 11/70* (2013.01); *C09K 11/883* (2013.01); *H01L 33/502* (2013.01)

(58) Field of Classification Search
CPC . C09K 11/025; C09K 11/0883; C09K 11/621; C09K 11/664; C09K 11/70; C09K 11/883; H01L 3/502; B82Y 20/00; B82Y 30/00; B82Y 40/00
See application file for complete search history.

(56) References Cited

U.S. PATENT DOCUMENTS

| 9,831,397 | B2* | 11/2017 | Theobald | ............. H01L 33/502 |
| 2017/0005241 | A1* | 1/2017 | Lotito | ..................... H01L 33/52 |
| 2017/0110625 | A1 | 4/2017 | Zhao et al. | |
| 2018/0230376 | A1* | 8/2018 | Schmidt | ............... C09K 11/025 |

FOREIGN PATENT DOCUMENTS

| CN | 109423619 A |   | 3/2019 |
| CN | 109796975   | * | 5/2019 |
| CN | 109796975 A |   | 5/2019 |
| CN | 109825282 A |   | 5/2019 |

OTHER PUBLICATIONS

Translation for CN 109796975, May 24, 2019.*
Aldeek, Fadi et al., Enhanced Optical Properties of Core/Shell/Shell CdTe/CdS/ZnO Quantum Dots Prepared in Aqueous Solution, J. Phys. Chem. C 2009, 113, pp. 19458-19467.
Kim, Hee Hong et al., Emissive CdTe/ZnO/GO quasi-core-shell-shell hybrid quantum dots for white light emitting diodes, Nanoscale, 2016, 8, pp. 19737-19743.
Ning, Ping-Fan et al., Enhancement of Photo-stability of Colloidal CdSe/ZnS Quantum Dots Passivated in SiO2, Chinese Journal of Luminescence, vol. 39, No. 2, Feb. 2018, pp. 109-114.
First Chinese Office Action dated Aug. 2, 2021 for Chinese Application No. 201910711600.1.

* cited by examiner

*Primary Examiner* — C Melissa Koslow
(74) *Attorney, Agent, or Firm* — Hunton Andrews Kurth LLP

(57) ABSTRACT

Provided are a quantum dot material, a preparation method and use thereof. The quantum material includes a quantum dot, and a first cladding layer and a second cladding clad outside of the quantum dot, wherein the first cladding layer is located between the quantum dot and the second cladding layer. The quantum dot material provided herein has good water and oxygen barrier properties and good stability.

15 Claims, No Drawings

QUANTUM DOT MATERIAL, AND PREPARATION METHOD AND USE THEREOF

CROSS-REFERENCES TO RELATED APPLICATIONS

The application claims the benefit of the earlier filing date of Chinese Patent Application No. 201910711600.1, filed on Aug. 2, 2019 to the CNIPA, the contents of which are incorporated by reference herein in its entirety.

TECHNICAL FIELD

The present disclosure belongs to the field of electro-optic display, and relates to a quantum dot material, and a preparation method and use thereof.

BACKGROUND

At present, white light sources mainly employ blue light emitting diode (LED) chips to excite yellow phosphor to achieve the effect of white light, and are widely applied to display and illumination. Taking display as an example, a common liquid crystal display (LCD) generally employs the above-mentioned white LED backlight source and a common color filter (CF) in conjunction with a liquid crystal cell on a panel to form color display. This manner has a narrow display color gamut, which generally can only reach 70% of the National Television System Committee (NTSC). The filter needs to filter other wavelengths of light to achieve the color display, which causes an overall utilization rate of the LCD to be only about 4%, thereby resulting in great energy wastes. Meanwhile, the display color gamut of this manner is generally only 70% of the NTSC standard, and is increasingly unable to meet the growing needs of people. With the development and progress of display technologies, quantum dots have demonstrated great potential in the display field due to their excellent optical properties. The use of a quantum dot material to replace a common phosphor material can not only greatly reduce energy losses of the LCD and improve energy utilization efficiency, but also expand the display color gamut to obtain better display effect, which has a great commercial prospect.

At present, the problem occurring when a quantum dot fluorescent material emits white light based on blue light is mainly the instability of the quantum dot when subjected to water, oxygen, heat, and light, especially in the presence of water and oxygen, heat and light will accelerate the fluorescence quenching of water and oxygen on the quantum dot material. Therefore, how to relieve the quenching effect of water and oxygen on the quantum dot to ensure the stability of the quantum dot has been an urgent problem to be solved.

In order to reduce the fluorescence quenching of water and oxygen on quantum dots, it is regarded as the most effective means to select an appropriate material to block water and oxygen. Li Liang's group in Shanghai Jiaotong University has proposed the use of silicon dioxide as a cladding material for the quantum dot. Zhong Haizheng's group in Beijing Institute of Technology uses a polymer (PMMA and PVDF) as the cladding material for the quantum dot. Xu Shu's group in Hebei University of Technology uses ligand modification to enhance the connection between a ligand and glue to anchor the ligand on the surface of the quantum dot, thereby improving the ability of the quantum dot to resist the quenching of water and oxygen. Cladding the quantum dot by an organic substance and an inorganic substance is the main method to improve the stability of the quantum dot. The ability of an organic substance to protect the quantum dot from water and oxygen is mainly determined by the water and oxygen barrier properties of the organic polymer. However, water and oxygen barrier abilities of a polymer differ greatly and the water and oxygen barrier properties decrease sharply when the polymer is aging. Cladding the quantum dot by an inorganic substance is implemented by dissociating and aggregating a precursor of a cladding layer on the surface of the quantum dot to cladding the quantum dot, which improves the water and oxygen barrier properties to a certain degree, but the compactness of the cladding layer needs to be improved. An atomic layer deposition (ALD) technology for cladding the quantum dot is a new type of cladding technology. Since the quantum dot is composed of an inorganic core and a surface ligand, the carrier gas of an ALD precursor is difficult to combine with the ligand on the surface of the quantum dot and it is difficult to take advantage of compact cladding of the ALD. Therefore, when the ALD technology is employed to directly clad a pure quantum dot, the quantum dot cannot be completely clad by an inorganic layer, so that the quantum dot is partially exposed in the air and it is thus difficult to achieve the purpose of blocking water and oxygen.

CN105779968A discloses a method for preparing a quantum dot thin film. The method includes the following steps: (1) depositing a metal oxide thin film with a thickness of nanos or sub-microns on the surface of a quantum dot by using an atomic layer deposition technology to clad the quantum dot; (2) coating the quantum dot clad by a metal oxide on an organic thin film, i.e. a polyethylene terephthalate substrate, to prepare a quantum dot thin film; (3) depositing a oxide thin film with a thickness of nanos or sub-microns on the quantum dot thin film and the surface of the quantum dot by using a space-isolated atomic layer deposition technology to ensure that the quantum dot is not oxidized. Although this patent solves the problem that the quantum dot is easily oxidized, the preparation process is complicated and a thin film material is finally obtained, which limits its application range.

Therefore, a quantum dot material with better water and oxygen barrier properties needs to be developed.

SUMMARY

The present disclosure aims to provide a quantum dot material, and a preparation method and use thereof. The quantum dot material provided by the present disclosure has compact cladding layers, good water and oxygen barrier properties, and good stability.

To achieve this object, the present disclosure adopts the technical solutions described below.

In a first aspect, the present disclosure provides a quantum dot material, including a quantum dot, and a first cladding layer and a second cladding layer clad outside of the quantum dot; wherein the first cladding layer is located between the quantum dot and the second cladding layer.

By providing two cladding layers on the outside of the quantum dot, the present disclosure can greatly improve water and oxygen barrier performance of the quantum dot material, thereby improving the stability of the quantum dot material to a certain degree.

Preferably, the first cladding layer is made of any one or a combination of at least two materials selected from a group consisting of $SiO_2$, $ZnO$, $Al_2O_3$, $TiO_2$, $Fe_3O_4$, and $Fe_2O_3$, preferably $SiO_2$.

In the present disclosure, an inorganic oxide that may be hydrolyzed to produce a hydroxyl group is preferably used as the first cladding layer. The existence of the first cladding layer not only can provide certain water and oxygen barrier properties, but also provides gas-solid chemical adsorption sites for preparing the second cladding layer, which facilitates continuous cladding and growing on the outside of the first cladding layer of the quantum dot, to form a complete and compact second cladding layer, thereby further ensuring the stability of the quantum dot.

Preferably, the first cladding layer has a thickness of 5 nm to 100 μm, for example, 10 nm, 50 nm, 100 nm, 500 nm, 1 μm, 5 μm, 10 μm, 50 μm, 90 μm or the like.

Preferably, the quantum dot is any one or a combination of at least two selected from a group consisting of CdSe, CdTe, CdS, ZnSe, CdTe, $CuInS_2$, InP, $CsPbX_3$, (X is a halogen, generally, X consists of any one of Cl, Br, and I.), CuZnSe, and ZnMnSe, preferably CdSe. Preferably, the second cladding layer is made of any one or a combination of at least two materials selected from a group consisting of $Al_2O_3$, $ZrO_2$, ZnO, ZnS, and $TiO_2$.

Preferably, the second cladding layer has a thickness of of 1 nm to 100 μm, for example, 5 nm, 10 nm, 50 nm, 100 nm, 500 nm, 1 μm, 5 μm, 10 μm, 50 μm, 90 μm or the like.

In a second aspect, the present disclosure provides a preparation method for the quantum dot material according to the first aspect. The preparation method includes steps described below:

(1) mixing a quantum dot solution and a precursor material of a first cladding layer, cladding by a reaction to obtain a quantum dot material with the first cladding layer; and (2) depositing a second cladding layer outside the quantum dot material with the first cladding layer by an atomic layer deposition method to obtain the quantum dot material.

The present disclosure dads the quantum dot with inorganic substances by a two-step method. The first cladding is performed on the surface of the quantum dot by a solution method. The existence of the first cladding layer not only provides certain water and oxygen barrier properties, but also provides gas-solid chemical adsorption sites for precursors used in the atomic layer deposition method. The second cladding is performed using an atomic layer deposition technology. The first cladding layer on the surface of the quantum dot allows the inorganic cladding layer obtained using the atomic layer deposition method to be completely deposited on the surface of the quantum dot material to obtain a compact cladding layer, which avoids exposed regions in the cladding layer resulted from uneven adsorption of the precursor when the quantum dot is directly clad by the atomic layer deposition method.

The present disclosure dads the quantum dot by the two-step method, which can greatly improve water and oxygen barrier properties of the quantum dot material, and thereby improves the stability of the quantum dot. The present disclosure combines the solution method and the atomic layer deposition method, and thus solves the problem of incompact cladding of the solution method and the problem of incomplete cladding when the atomic layer deposition method is directly adopted to perform cladding on the surface of the quantum dot, thereby greatly improving the stability of the quantum dot. The combination of the solution method and the atomic layer deposition method has greatly expanded the range of cladding materials that can be used for the quantum dot, and increased the selectivity of the cladding materials. Preferably, the quantum dot solution has a concentration of 1 mg/mL to 200 mg/mL, for example, 5 mg/mL, 10 mg/mL, 20 mg/mL, 50 mg/mL, 80 mg/mL, 100 mg/mL, 120 mg/mL, 150 mg/mL, 180 mg/mL or the like.

Preferably, the precursor material is any one or a combination of at least two selected from a group consisting of tetramethoxysilane, tetraethoxysilane, zinc acetylacetonate, aluminum acetylacetonate, tetrabutyl titanate, and iron acetylacetonate, further preferably tetramethoxysilane and/or tetraethoxysilane.

Preferably, the precursor material is added in an amount of 0.1% to 10%, for example, 0.2%, 0.5%, 1%, 2%, 4%, 5%, 8% or the like.

In the present disclosure, the atomic layer deposition method includes steps described below.

(A) in a vacuum environment, reacting the quantum dot material with the first cladding layer with a first precursor at a reaction temperature; and (B) reacting with a second precursor; repeating step (A) and step (B) in sequence to obtain the quantum dot material.

The present disclosure can control the thickness of the cladding layer by controlling repetition times.

Preferably, the first precursor in step (A) includes any one or a combination of at least two selected from a group consisting of trimethylaluminum, triethylaluminum, tetrakis (dimethylamino)zirconium, biscyclopentadienyl dimethyl zirconium, dimethyl zinc, diethyl zinc, and tetramethoxy titanium.

Preferably, the second precursor in step (B) includes any one or a combination of at least two selected from a group consisting of water, hydrogen sulfide, methanol, ethanol, and ammonia.

Preferably, the reaction temperature is 60° C. to 120° C., for example, 80° C., 100° C., 120° C., 140° C., 160° C., 180° C. or the like.

Preferably, performing step (A) and step (B) once is referred as one reaction cycle, and the one reaction cycle last for 2 min to 20 min, for example, 4 min, 6 min, 8 min, 10 min, 12 min, 14 min, 16 min, 18 min or the like.

Preferably, the reaction cycle is repeated 10 times to 500 times, for example, 50 times, 100 times, 200 times, 300 times, 400 times or the like.

Preferably, a cleaning gas is required to be introduced to clean the reaction environment both after the reaction with the first precursor is finished and after the reaction with the second precursor is finished.

The cleaning gas refers to a gas that does not react with a reactant or a product, and may also be referred to as an inert gas.

The cleaning gas is introduced to, on one hand, clean the pipeline, and on the other hand, to clean the excess first precursor and by-products in the reaction system.

As a preferred solution of the present disclosure, the preparation method includes steps described below:

(I) mixing a quantum dot solution with a concentration of 1 mg/mL to 200 mg/mL and a precursor material of a first cladding layer, cladding by a reaction to obtain a quantum dot material with the first cladding layer;

(II) in a vacuum environment, reacting the quantum dot material precursor with a first precursor at 60° C. to 200° C.;

(III) after the reaction with the first precursor is finished, introducing a cleaning gas to clean the reaction environment;

(IV) introducing a second precursor to react; and (V) after the reaction with the second precursor is finished, introducing a cleaning gas to clean the reaction environment. repeating step (II) to step (V) in sequence 10 times to 500 times to obtain the quantum dot material.

In a third aspect, the present disclosure provides use of the quantum dot material according to the first aspect in a display backlight plate or a light conversion material.

Compared with the related art, the present disclosure has the following beneficial effects:

(1) By providing two cladding layers on the outside of the quantum dot, the present disclosure can greatly improve the water and oxygen barrier performance of the quantum dot material, thereby improving the stability of the quantum dot material to a certain degree.

(2) The present disclosure dads the quantum dot by the two-step method, which can greatly improve the water and oxygen barrier properties of the quantum dot material, and thereby improves the stability of the quantum dot. The present disclosure combines the solution method and the atomic layer deposition method, and thus solves the problem of incompact cladding of the solution method and the problem of incomplete cladding when the atomic layer deposition method is directly adopted to perform cladding on the surface of the quantum dot, and has greatly expanded the range of cladding materials that can be used for the quantum dot, and increased the selectivity of the cladding materials.

(3) The quantum dot material provided by the present disclosure has good water and oxygen barrier properties and good stability. The quantum dot material may be continuously lit for 1000 h under a power density of 808 mW/cm$^2$, with fluorescence decay within 20%.

DETAILED DESCRIPTION

The technical solutions of the present disclosure are further described below through specific embodiments. Those skilled in the art should understand that the embodiments are merely used to help understand the present disclosure and should not be regarded as specific limitations on the present disclosure.

EXAMPLE 1

A quantum dot material was prepared as follows:

(1) 20 mL of a solution of CdSe in toluene with a concentration of 1 mg/mL was prepared. 20 μL of a precursor, i.e. tetramethoxysilane was added and stirred. Under the action of water in the air, the tetramethoxysilane was slowly hydrolyzed into silicon dioxide which was clad on the surface of the quantum dot. The clad quantum dot was centrifuged and lyophilized to obtain CdSe@SiO$_2$ powder (SiO$_2$-clad CdSe powder).

(2) The quantum dot powder was placed in the cavity of an ALD device, and the cavity was vacuumed and heated to 60° C. Trimethylaluminum gas was loaded through N$_2$ to react with groups on the surface of the quantum dot powder to be adsorbed, and then N$_2$ was introduced again to remove excess trimethylaluminum and by-products. Water vapor was then loaded through N$_2$, and adsorbed onto the surface of the first precursor and reacted with the first precursor, and then N$_2$ was introduced again to remove excess water vapor and by-products.

This was one cycle which lasted 2 min. The cycle was repeated 500 times to obtain CdSe@SiO$_2$@Al$_2$O$_3$ powder.

EXAMPLE 2

A quantum dot material was prepared as follows:

(1) 40 mL of a solution of InP in chloroform with a concentration of 10 mg/mL was prepared. 50 μL of a precursor, i.e. tetrabutyl titanate and 50 μL of water were added and stirred. Under the action of the water, the tetrabutyl titanate was slowly hydrolyzed into titanium dioxide which was clad on the surface of the quantum dot. The clad quantum dot was centrifuged, deposited and lyophilized to obtain InP@TiO$_2$ powder.

(2) The quantum dot powder was placed in the cavity of an ALD device, and the cavity was vacuumed and heated to 60° C. Triethylaluminum gas was loaded through N$_2$ to react with groups on the surface of the powder of the quantum dot to be adsorbed, and then N$_2$ was introduced again to remove excess triethylaluminum and by-products. Water vapor was then loaded through N$_2$, adsorbed onto the surface of the first precursor and reacted with the first precursor, and then N$_2$ was introduced again to remove excess water vapor and by-products.

This was a cycle which lasted 3 min. The cycle was repeated 250 times to obtain InP@TiO$_2$@Al$_2$O$_3$ powder.

EXAMPLE 3

A quantum dot material was prepared as follows:

(1) 60 mL of a solution of CsPbBr$_3$ in toluene with a concentration of 20 mg/mL was prepared. 100 μL of a precursor, i.e. tetraethoxysilane was added and stirred. Under the action of water in the air, the tetraethoxysilane was slowly hydrolyzed into zirconium dioxide which was clad on the surface of the quantum dot. The clad quantum dot was centrifuged, and the obtained deposit was lyophilized to obtain CsPbBr$_3$@SiO$_2$ powder.

(2) The quantum dot powder was placed in the cavity of an ALD device, and the cavity was vacuumed and heated to 60° C. Biscyclopentadienyl dimethyl zirconium was loaded through N$_2$ to react with groups on the surface of the powder of the quantum dot to be adsorbed, and then N$_2$ was introduced again to remove excess biscyclopentadienyl dimethyl zirconium and by-products. Water vapor was then loaded through N$_2$, adsorbed onto the surface of the first precursor and reacted with the first precursor, and then N$_2$ was introduced again to remove excess water vapor and by-products.

This was a cycle which lasted 4 min. The cycle was repeated 100 times to obtain CsPbBr$_3$@SiO$_2$@ZrO$_2$ powder.

EXAMPLE 4

A quantum dot material was prepared as follows:

(1) 20 mL of a solution of CuInS$_2$ in toluene with a concentration of 200 mg/mL was prepared. 200 μL of a precursor, i.e. iron acetylacetonate was added and stirred. Under the action of water in the air, the iron acetylacetonate was slowly hydrolyzed into iron trioxide which was clad on the surface of the quantum dot. The clad quantum dot was centrifuged, and the obtained deposit was lyophilized to obtain CuInS$_2$@Fe$_2$O$_3$ powder.

(2) The quantum dot powder was placed in the cavity of an ALD device, and the cavity was vacuumed and heated to 60° C. Diethyl zinc gas was loaded through N$_2$ to react with groups on the surface of the powder of the quantum dot to be adsorbed, and then N$_2$ was introduced again to remove excess diethyl zinc and by-products. Hydrogen sulfide gas was then loaded through N$_2$, adsorbed onto the surface of the first precursor and reacted with the first precursor, and then N$_2$ was introduced again to remove the excess hydrogen sulfide gas and by-products.

This was a cycle which lasted 6 min. The cycle was repeated 100 times to obtain $CuInS_2@Fe_2O_3@ZnS$ powder.

EXAMPLE 5

A quantum dot material was prepared as follows:

(1) 20 mL of a solution of CdSe in toluene with a concentration of 20 mg/mL was prepared. 100 μL of a precursor, i.e. tetramethoxysilane was added and stirred. Under the action of water in the air, the tetramethoxysilane was slowly hydrolyzed into silicon dioxide which was clad on the surface of the quantum dot. The clad quantum dot was centrifuged, and the obtained deposit was lyophilized to obtain $CdSe@SiO_2$ powder.

(2) The quantum dot powder was placed in the cavity of an ALD device, and the cavity was vacuumed and heated to 80° C. Trimethylaluminum gas was loaded through $N_2$ to react with groups on the surface of the powder of the quantum dot to be adsorbed, and then $N_2$ was introduced again to remove excess trimethylaluminum and by-products. Water vapor was then loaded through $N_2$, adsorbed onto the surface of the first precursor and reacted with the first precursor, and then $N_2$ was introduced again to remove excess water vapor and by-products.

This was a cycle which lasted 10 min. The cycle was repeated 50 times to obtain $CdSe@SiO_2Al_2O_3$ powder.

EXAMPLE 6

A quantum dot material was prepared as follows:

(1) 20 mL of a solution of CdSe in toluene with a concentration of 20 mg/mL was prepared. 100 μL of a precursor, i.e. tetramethoxysilane was added and stirred. Under the action of water in the air, the tetramethoxysilane was slowly hydrolyzed into silicon dioxide which was clad on the surface of the quantum dot. The clad quantum dot was centrifuged, and the obtained deposit was lyophilized to obtain $CdSe@SiO_2$ powder.

(2) The quantum dot powder was placed in the cavity of an ALD device, and the cavity was vacuumed and heated to 100° C. Trimethylaluminum gas was loaded through $N_2$ to react with groups on the surface of the powder of the quantum dot to be adsorbed, and then $N_2$ was introduced again to remove excess trimethylaluminum and by-products. Water vapor was then loaded through $N_2$, adsorbed onto the surface of the first precursor and reacted with the first precursor, and then $N_2$ was introduced again to remove excess water vapor and by-products.

This was a cycle which lasted 15 min. The cycle was repeated 20 times to obtain $CdSe@SiO_2@Al_2O_3$ powder.

EXAMPLE 7

A quantum dot material was prepared as follows:

(1) 20 mL of a solution of CdSe in toluene with a concentration of 20mg/mL was prepared. 100 μL of a precursor, i.e. tetramethoxysilane was added and stirred. Under the action of water in the air, the tetramethoxysilane was slowly hydrolyzed into silicon dioxide which was clad on the surface of the quantum dot. The clad quantum dot was centrifuged, and the obtained deposit was lyophilized to obtain $CdSe@SiO_2$ powder.

(2) The quantum dot powder was placed in the cavity of an ALD device, and the cavity was vacuumed and heated to 150° C. Trimethylaluminum gas was loaded through $N_2$ to react with groups on the surface of the powder of the quantum dot to be adsorbed, and then $N_2$ was introduced again to remove excess trimethylaluminum and by-products. Water vapor was then loaded through $N_2$, adsorbed onto the surface of the first precursor and reacted with the first precursor, and then $N_2$ was introduced again to remove excess water vapor and by-products.

This was a cycle which lasted 20 min. The cycle was repeated 10 times to obtain $CdSe@SiO_2@Al_2O_3$ powder.

EXAMPLE 8

A quantum dot material was prepared as follows:

(1) 20 mL of a solution of CdSe in toluene with a concentration of 20 mg/mL was prepared. 100 μL of a precursor, i.e. tetramethoxysilane was added and stirred. Under the action of water in the air, the tetramethoxysilane was slowly hydrolyzed into silicon dioxide which was clad on the surface of the quantum dot. The clad quantum dot was centrifuged, and the obtained deposit was lyophilized to obtain $CdSe@SiO_2$ powder.

(2) The quantum dot powder was placed in the cavity of an ALD device, and the cavity was vacuumed and heated to 200° C. Trimethylaluminum gas was loaded through $N_2$ to react with groups on the surface of the powder of the quantum dot to be adsorbed, and then $N_2$ was introduced again to remove excess trimethylaluminum and by-products. Water vapor was then loaded through $N_2$, adsorbed onto the surface of the first precursor and reacted with the first precursor, and then $N_2$ was introduced again to remove excess water vapor and by-products.

This was a cycle which lasted 20 min. The cycle was repeated 10 times to obtain $CdSe@SiO_2@Al_2O_3$ powder.

EXAMPLE 9

The difference from Example 1 was that the tetramethoxysilane was replaced with aluminum acetylacetonate.

COMPARATIVE EXAMPLE 1

The difference from Example 1 was that only step (1) was performed and step (2) was not performed to obtain a quantum dot material.

COMPARATIVE EXAMPLE 2

The difference from Example 1 was that only step (2) was performed 500 times and step (1) was not performed to obtain a quantum dot material.

Performance Test

A performance test was performed on quantum dot materials provided by Examples 1 to 9 and Comparative example 1 to 2 by the following method:

(1) Light aging test: the quantum dot materials were lit on a pure blue LED, with a blue light wavelength of 450 nm, a power of about 38 mW, an inner slot area of 0.047 $cm^2$, and an optical power density of 808 $mW/cm^2$; an ambient temperature of 20° C., and humidity of about 80%; and a concentration of quantum dot glue of 100 mg/g. Light conversion rates of the quantum dot materials were tested using an ATA500 single-integrating sphere after lit for 240 h and 1000 h to calculate aging/decaying rates.

Test results are listed in table 1.

TABLE 1

| Sample | Time (h) | Aging/Decaying (%) | Time (h) | Aging/Decaying (%) |
|---|---|---|---|---|
| Example 1 | 240 | 3.9% | 1000 | 16.7% |
| Example 2 | 240 | 4.1% | 1000 | 18.9% |
| Example 3 | 240 | 4.3% | 1000 | 17.6% |
| Example 4 | 240 | 4.6% | 1000 | 19.3% |
| Example 5 | 240 | 3.6% | 1000 | 16.8% |
| Example 6 | 240 | 4.2% | 1000 | 18.9% |
| Example 7 | 240 | 3.6% | 1000 | 19.6% |
| Example 8 | 240 | 5.1% | 1000 | 17.3% |
| Example 9 | 240 | 3.3% | 1000 | 18.2% |
| Comparative example 1 | 240 | 40% | 1000 | 70% |
| Comparative example 2 | 240 | 60% | 1000 | 85% |

It can be known from the examples and the performance test that the quantum dot materials provided by the present disclosure have excellent water and oxygen barrier properties and good stability. Light conversion efficiency of the quantum dot materials is maintained above 80% when they are lit for 1000 h under high-intensity blue light.

It can be seen from the comparison between Example 1 and Example 9 that the first cladding layer provided by the present disclosure is preferably a silicon dioxide cladding layer, which can make the final quantum dot material more stable. It can be seen from the comparison between Example 1 and Comparative examples 1 and 2 that the quantum dot material having two cladding layers provided by the present disclosure has better water and oxygen barrier properties and better stability.

The applicant has stated that although the quantum dot material, and the preparation method and use thereof in the present disclosure are described through the embodiments described above, the present disclosure is not limited to the detailed methods described above, which means that implementation of the present disclosure does not necessarily depend on the detailed methods described above. It should be apparent to those skilled in the art that any improvements made to the present disclosure, and equivalent replacements of various raw materials, the addition of adjuvant ingredients and the selection of specific manners, etc. in the present disclosure all fall within the protection scope and the scope of disclosure of the present disclosure.

What is claimed is:

1. A preparation method for a quantum dot material, comprising:
   (1) mixing a quantum dot solution and a precursor material of a first cladding layer, cladding by a reaction to obtain a quantum dot material with the first cladding layer; and
   (2) depositing a second cladding layer outside the quantum dot material with the first cladding layer by an atomic layer deposition method to obtain the quantum dot material;
   wherein the quantum dot solution has a concentration of 1 mg/mL to 200 mg/mL, the precursor material is added in an amount of 0.1% to 10%;
   the quantum dot material, comprising a quantum dot, and a first cladding layer and a second cladding layer clad outside of the quantum dot;
   wherein the first cladding layer is located between the quantum dot and the second cladding layer.

2. The preparation method according to claim 1, wherein the first cladding layer is made of any one or a combination of at least two materials selected from a group consisting of $SiO_2$, ZnO, $Al_2O_3$, $TiO_2$, $Fe_3O_4$, and $Fe_2O_3$.

3. The preparation method according to claim 1, wherein the first cladding layer has a thickness of 5 nm to 100 μm.

4. The preparation method according to claim 1, wherein the quantum dot is any one or a combination of at least two selected from a group consisting of CdSe, CdTe, CdS, ZnSe, CdTe, $CuInS_2$, InP, $CsPbX_3$, CuZnSe, and ZnMnSe, wherein X is a halogen.

5. The preparation method according to claim 1, wherein the second cladding layer is made of any one or a combination of at least two materials selected from a group consisting of $Al_2O_3$, $ZrO_2$, ZnO, ZnS, and $TiO_2$.

6. The preparation method according to claim 1, wherein the second cladding layer has a thickness of 1 nm to 100 μm.

7. The preparation method according to claim 1, wherein the precursor material is any one or a combination of at least two selected from a group consisting of tetramethoxysilane, tetraethoxysilane, zinc acetylacetonate, aluminum acetylacetonate, tetrabutyl titanate, and iron acetylacetonate.

8. The preparation method according to claim 1, wherein the atomic layer deposition method comprises:
   (A) in a vacuum environment, reacting the quantum dot material with the first cladding layer with a first precursor at a reaction temperature; and
   (B) reacting with a second precursor; and
   repeating step (A) and step (B) in sequence to obtain the quantum dot material.

9. The preparation method according to claim 8, wherein the first precursor in step (A) comprises any one or a combination of at least two selected from a group consisting of trimethylaluminum, triethylaluminum, tetrakis(dimethylamino)zirconium, biscyclopentadienyl dimethyl zirconium, dimethyl zinc, diethyl zinc, and tetramethoxy titanium.

10. The preparation method according to claim 8, wherein the second precursor in step (B) comprises any one or a combination of at least two selected from a group consisting of water, hydrogen sulfide, methanol, ethanol, and ammonia.

11. The preparation method according to claim 8, wherein the reaction temperature is 60° C. to 120° C.

12. The preparation method according to claim 8, wherein performing step (A) and step (B) once is referred as one reaction cycle, and the one reaction cycle lasts for 2 min to 20 min.

13. The preparation method according to claim 8, wherein the reaction cycle is repeated 10 times to 500 times.

14. The preparation method according to claim 8, wherein a cleaning gas is required to be introduced to clean the reaction environment both after the reaction with the first precursor is finished and after the reaction with the second precursor is finished.

15. The preparation method according to claim 1, comprising:
   (I) mixing a quantum dot solution with a concentration of 1 mg/mL to 200 mg/mL and a precursor material of a first cladding layer, cladding by a reaction to obtain a quantum dot material with a first cladding layer;
   (II) in a vacuum environment, reacting the quantum dot material with the first cladding layer with a first precursor at 60° C. to 200° C.;
   (III) after the reaction with the first precursor is finished, introduce a cleaning gas to clean the reaction environment;
   (IV) introducing a seco9nd precursor to react: and (V) after the reaction with the second precursor is finished; introduce a cleaning gas to clean the reaction environment; and repeating steps (II) to step (V) in sequence 10 times to 500 times to obtain the quantum dot material.

\* \* \* \* \*